(12) United States Patent
Kim et al.

(10) Patent No.: US 7,656,232 B2
(45) Date of Patent: Feb. 2, 2010

(54) WIDEBAND VARIABLE GAIN AMPLIFIER WITH CLIPPING FUNCTION

(75) Inventors: Chang Sun Kim, Gwangju-si (KR); Ki Jeon, Namyangju-si (KR)

(73) Assignee: Medison Co., Ltd., Seoul (KR)

( * ) Notice: Subject to any disclaimer, the term of this patent is extended or adjusted under 35 U.S.C. 154(b) by 22 days.

(21) Appl. No.: 12/163,933

(22) Filed: Jun. 27, 2008

(65) Prior Publication Data
US 2009/0002073 A1    Jan. 1, 2009

(30) Foreign Application Priority Data
Jun. 29, 2007   (KR) .................. 10-2007-0064885

(51) Int. Cl.
*H03G 3/00*   (2006.01)
(52) U.S. Cl. .................. 330/278; 330/147; 330/116
(58) Field of Classification Search .................. 330/278, 330/147, 116
See application file for complete search history.

(56) References Cited
U.S. PATENT DOCUMENTS

| | | | | |
|---|---|---|---|---|
| 4,742,312 A | * | 5/1988 | Osburn et al. | 330/298 |
| 4,934,770 A | * | 6/1990 | Anderson et al. | 330/278 |
| 5,406,223 A | * | 4/1995 | Vulih et al. | 330/258 |
| 6,714,062 B2 | * | 3/2004 | Kappes | 327/321 |
| 7,474,149 B2 | * | 1/2009 | Snelgrove et al. | 330/136 |
| 2009/0140810 A1 | * | 6/2009 | Kim et al. | 330/254 |

* cited by examiner

*Primary Examiner*—Patricia Nguyen
(74) *Attorney, Agent, or Firm*—Jones Day (57) ABSTRACT

The present invention relates to a variable gain amplifier. The variable gain amplifier includes an input unit including first and second input nodes and an output node, the input unit being configured to receive first and second input signals. The variable gain amplifier further includes a first clipping unit operable to clip a voltage level at the output node to be equal to or lower than a level of a first reference voltage and a second clipping unit operable to clip a voltage level at the output node to be equal to or greater than a level of a second reference voltage, wherein the second reference voltage is lower than the first reference voltage. A predetermined level of a voltage is outputted through an output unit included in the variable gain amplifier based on the clipped voltage level.

6 Claims, 6 Drawing Sheets

WIDEBAND VARIABLE GAIN AMPLIFIER WITH CLIPPING FUNCTION

The present application claims priority from Korean Patent Application No. 10-2007-0064885 filed on Jun. 29, 2007, the entire subject matter of which is incorporated herein by reference.

BACKGROUND OF THE INVENTION

1. Technical Field

The present invention generally relates to a variable gain amplifier, and more particularly to a wide-band variable gain amplifier with a clipping function.

2. Background Art

The ultrasound system has become an important and popular diagnostic tool due to its non-invasive and non-destructive nature. Modern high-performance ultrasound imaging diagnostic systems and techniques are commonly used to produce two- or three-dimensional images of internal features of patients.

An ultrasound system generally uses a probe containing an array of piezoelectric elements to transmit and receive ultrasound signals. The ultrasound system forms an image of human internal tissues by electrically exciting transducer elements to generate ultrasound signals that travel into the body. Echoes reflected from tissues and organs return to the transducer element and are converted into analog electrical receive signals (hereinafter referred to as "analog receive signals"). The transducer elements may output low amplitudes of the analog receive signals. Thus, the amplitudes of the analog electrical receive signals should be pre-amplified. Pre-amplification is carried out by a pre-amplifier installed on an output terminal of the transducer elements.

When the ultrasound signals are propagated into the tissues of the target object, their amplitude is attenuated. Thus, the attenuation of the ultrasound signals has to be compensated so as to obtain an accurate ultrasound image. Compensation may be achieved by adjusting the gain of the pre-amplified analog receive signals. The gain of the analog receive signals is usually adjusted by a variable gain amplifier.

The compensated analog receive signals are inputted into an analog-to-digital converter (ADC) for digital processing. That is, the analog receive signals are converted into digital receive signals by the ADC. Subsequently, receive-focusing and digital signal processing are carried out upon the digital receive signals to thereby form ultrasound image data.

Further, the analog receive signals may be amplified by the variable gain amplifier beyond an amplitude range allowable for input to the ADC by the variable gain amplifier. If the analog receive signals are amplified beyond an allowable amplitude range as an ADC input or a recovery time is increased due to overload, the ADC may malfunction so that an accurate ultrasound image signal may be not obtained. Thus, a wide-band variable gain amplifier capable of outputting amplified analog receive signals within a limited amplitude range is needed.

DETAILED DESCRIPTION OF THE INVENTION

Figure 1:
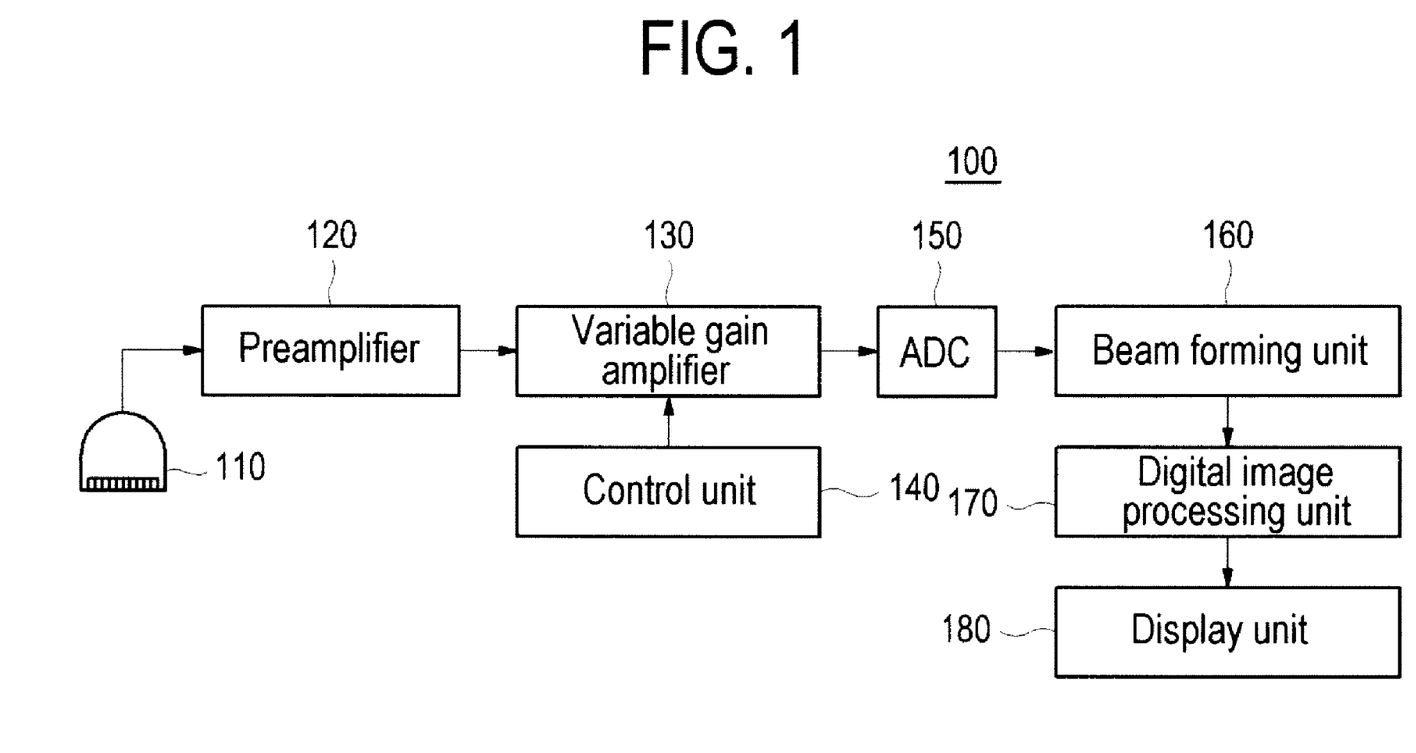
FIG. 1 is a block diagram showing an ultrasound diagnostic system constructed in accordance with the present invention.

FIG. 1 is a block diagram showing an ultrasound diagnostic system constructed in accordance with the present invention. As shown in FIG. 1, the ultrasound diagnostic system 100 includes a probe 110, a preamplifier 120, a variable gain amplifier 130, a control unit 140, an analog-to-digital converter (ADC) 150, a beam forming unit 160, a digital image processing unit 170 and a display unit 180.

The probe 110 may include at least one transducer element. An array transducer may be included in the probe 110. The probe 110 may be operable to generate ultrasound signals to be transmitted to a target object in response to electrical transmit pulses. The probe 110 may be further operable to convert echo signals reflected from the target object into electrical analog receive signals. The preamplifier 120 may be operable to amplify the analog receive signals, the amplitudes of which are low, so as to be processed in the ultrasound diagnostic system.

The variable gain amplifier 130, which is a wideband amplifier, may be operable to adjust the gain of the analog receive signals amplified by the preamplifier 120 so as to compensate for attenuation of the ultrasound signals during propagation in the target object. The analog receive signals may be variably amplified according to a degree of the attenuation of the ultrasound signals in response to a control signal outputted from the control unit 140. That is, the gain of the variable gain amplifier 130 may be increased to amplify the analog receive signals corresponding to the attenuated echo signals reflected from a position relatively far from the probe 110. The control unit 140 may be operable to transmit control signals to the variable gain amplifier 130 so as to adjust the gain of the analog receive signals.

The variable gain amplifier 130 may be further operable to clip the analog receive signals to be within a predetermined voltage range, within which the ADC 150 may normally function, in accordance with the present invention. The analog receive signals are converted into the digital signals by the ADC 150. The digital signals outputted from the ADC 150 are receive-focused in the beam forming unit 160. The image signal processing unit 170 may be operable to perform digital image processing upon the receive-focused digital signals to thereby output image signals. The display unit 180 may be operable to display an ultrasound image of the target object based on the image signals.

Figure 2:
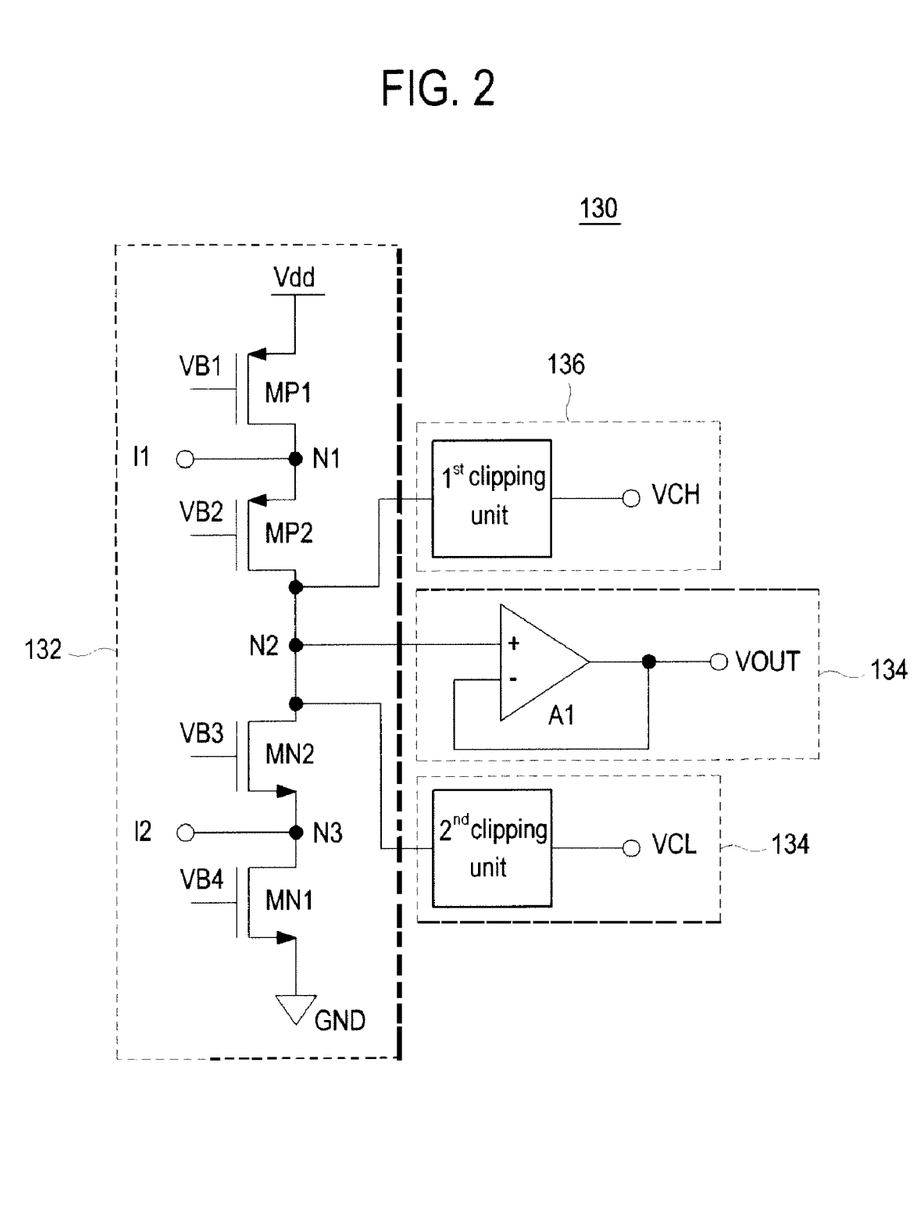
FIG. 2 is a circuit diagram showing a variable gain amplifier in accordance with one embodiment of the present invention.

FIG. 2 is a circuit diagram showing the variable gain amplifier 130 in accordance with one embodiment of the present invention. As illustrated in FIG. 2, the variable gain amplifier 130 may include an input unit 132, an output unit 134, a first clipping unit 136 and a second clipping unit 138.

The input unit 132 may be operable to receive a first input signal I1 and a second input signal I2. The first and second input signals I1 and I2 are complementary in polarity. The input unit 132 may include a first node N1 for receiving the first input signal I1, a first P-type metal-oxide-semiconductor (PMOS) transistor MP1 coupled between a power supply voltage Vdd and the first node N1, and a second PMOS transistor MP2 coupled between the first node N1 and a second node N2. The first node N1 is the junction of the source and the drain of the PMOS transistors MP1 and MP2.

The second node N2 is connected to the output unit 134. The input unit 132 may further include a third node N3 for receiving the second input signal I2, a first N-type metal-oxide-semiconductor (NMOS) transistor MN1 coupled between the third node N3 and a ground GND, and a second NMOS transistor MN2 coupled between the second node N2 and the third node N3. The third node N3 is the junction of the source and drain of the NMOS transistors MN1 and MN2. The second node N2 is a junction of the second PMOS transistor MP2 and the second NMOS transistor MN2.

Constant bias voltages VB1, VB2, VB3 and VB4 may be applied to the gates of the respective transistors MP1, MP2, MN1 and MN2. The current I flowing in a transistor may be defined as the following equation (I).

$$I = \frac{1}{2}\mu C_{ox}\frac{W}{L}(V_{gs} - V_{th})^2 \quad (1)$$

Wherein $\mu$ represents mobility of majority carriers in the channel, W and L represent a width and length of a gate, and Cox represents a capacitance of a gate oxide per unit area. As can be seen from the equation (1), for a known threshold voltage Vth of the transistor, the current I depends on a gate-source voltage Vgs. Since the power supply voltage Vdd is connected to the source of the first PMOS transistor MP1 and the constant bias voltage VB1 is applied to the gate thereof, a constant current $I_{MP1}$ flows in the first PMOS transistor MP1. Thus, a current $I_{MP2}$ flowing in the second PMOS transistor MP2 may be defined as the following equation (2).

$$I_{MP2} = I_{MP1} - I1 \quad (2)$$

Since $I_{MP1}$ is a constant, $I_{MP2}$ depends on the first input signal I1. That is, if current of the first input signal I1 decreases, $I_{MP2}$ increases so that a voltage level at the second node N2 increases.

Also, since the source of the first NMOS transistor MN1 is connected to the ground GND and the constant bias voltage VB3 is applied to a gate thereof, a constant current $I_{MN1}$ may flow. Thus, a current $I_{MN2}$ flowing through the second NMOS transistor MN2 may be defined as the following equation (3).

$$I_{MN2} = I_{MN1} - I2 \quad (3)$$

Since $I_{MN1}$ is a constant, $I_{MN2}$ depends on the second input signal I2. That is, if a current of the first input signal I2 decreases, $I_{MP2}$ increases so that the voltage level at the second node N2 increases.

The output unit 134 may include a first amplifier A1. The first amplifier A1 may be configured such that a first input terminal is connected to the second node N2 and an output thereof is fed back to a second input terminal.

The first clipping unit 136 may be operable to compare a voltage level of the second node N2 with a level of a first reference voltage VCH. The first reference voltage VCH may be determined by a maximum voltage capable of being processed by the ADC 150. If the voltage level of the second node N2 is greater than that of the first reference voltage VCH, then the first clipping unit 136 may be connected to the second node N2 such that the current of the second node N2 flows into the first clipping unit 136. Thus, an increase of the voltage level at the second node N2 over the level of the first reference voltage VCH can be prevented. That is, the voltage level of the second node N2 is clipped at the level of the first reference voltage VCH.

Figure 3:
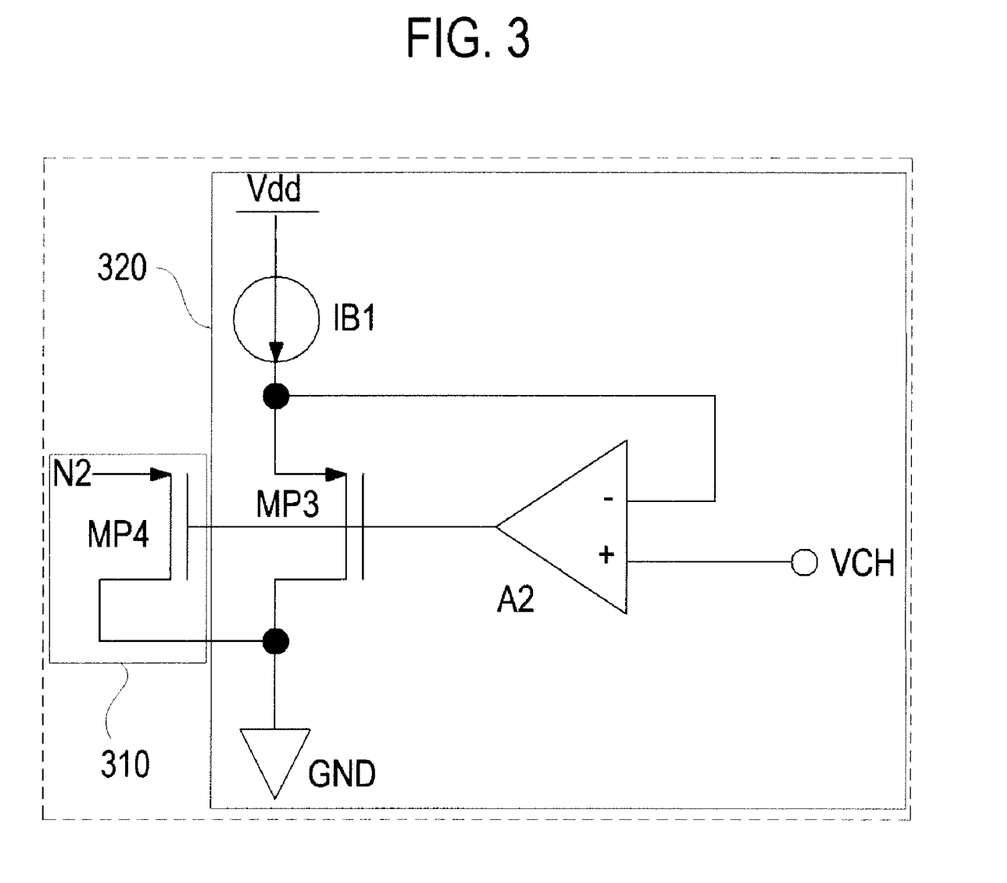
FIG. 3 is a circuit diagram showing a first clipping unit in accordance with one embodiment of the present invention.

FIG. 3 is a circuit diagram showing the first clipping unit 136 in accordance with one embodiment of the present invention. As illustrated in FIG. 3, the first clipping unit 136 may include a first switching unit 310 and a first control unit 320. The first switching unit 310 may be embodied with a fourth PMOS transistor MP4. The source of the fourth PMOS transistor MP4 is connected to the second node N2 and the drain thereof is connected to the ground GND. The first control unit 320 may be operable to generate a first control signal for controlling a switching operation of the switching unit 310. The first control signal is applied to the gate of the PMOS transistor MP4. When a source voltage level of the fourth PMOS transistor MP4 becomes greater than the level of the first reference voltage VCH, a voltage level of the first control signal becomes greater than a level of a gate-source voltage Vgs of the PMOS transistor MP4. Thus, if the voltage level of the second node N2 becomes greater than the level of the first reference voltage VCH, then the first switching unit 310 turns on in response to the first control signal so that the second node N2 is connected to the ground GND.

The first control unit 320 may include a first current source IB1 coupled to the power supply voltage Vdd for providing a constant current, a second amplifier A2 whose one input terminal is connected to an output of the first current source IB1 and the other input terminal is connected to the first reference voltage VCH, and a third PMOS transistor MP3 coupled between the first current source IB1 and the ground GND. The gate of the third PMOS transistor MP3 is connected to an output terminal of the second amplifier A2. The control unit 320 may be operable to generate the first control signal having a constant voltage level due to a virtual ground.

When the source voltage level of the fourth PMOS transistor MP4 whose gate is connected to the output terminal of the second amplifier A2 becomes the level of the first voltage VCH, the fourth PMOS transistor MP4 turns on to thereby connect the second node N2 to the ground GND. Thus, the voltage level of the second node N2 can be prevented from exceeding the level of the first reference voltage VCH. That is, the voltage level of the second node N2 is clipped at the level of the first reference voltage VCH.

Figure 4:
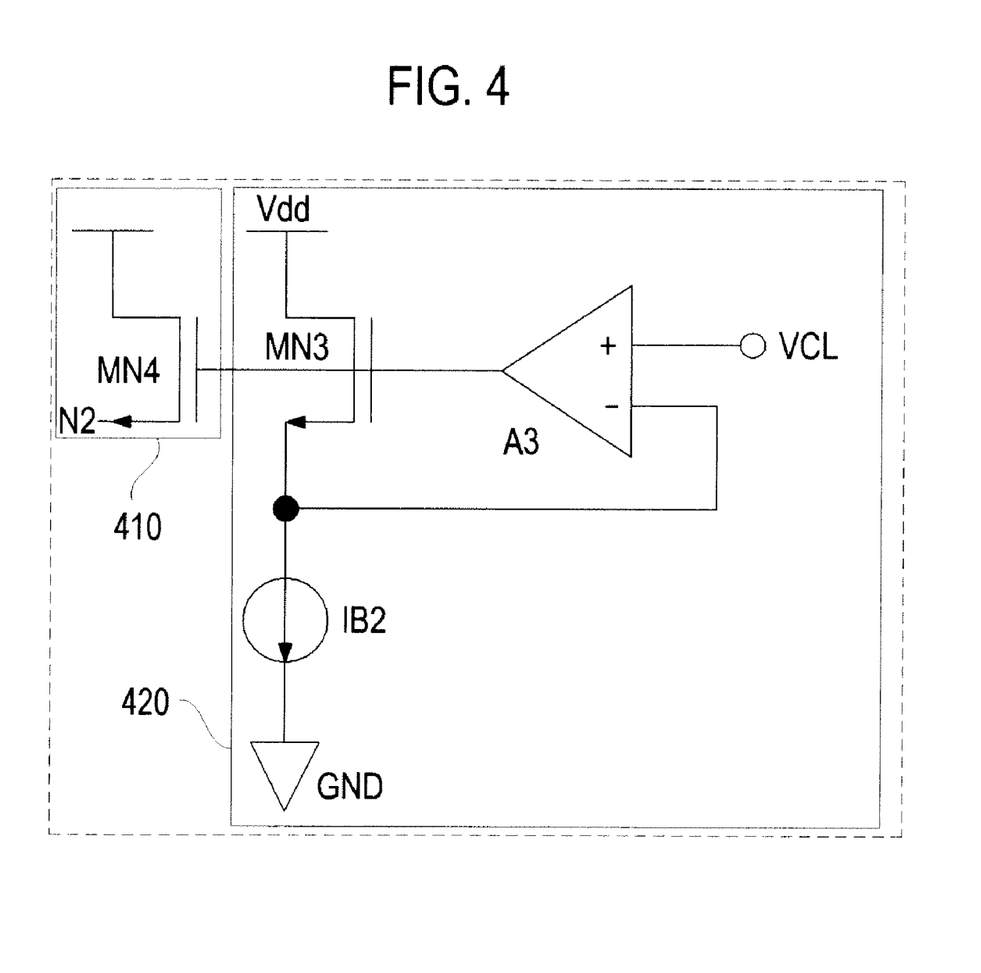
FIG. 4 is a circuit diagram showing a second clipping unit in accordance with one embodiment of the present invention.

FIG. 4 is a circuit diagram showing the second clipping unit 138 in accordance with one embodiment of the present invention. As shown in FIG. 4, the second clipping unit 138 may include a second switching unit 410 and a second control unit 420. The second switching unit 410 may be embodied with a fourth NMOS transistor MN4 in one embodiment. The drain of the fourth NMOS transistor MN4 is connected to the power supply voltage Vdd and the source thereof is connected to the second node N2. The second control unit 420 may be operable to generate a second control signal for controlling a switching operation of the second switching unit 410. The second control signal is applied to the gate of the fourth NMOS transistor MN4. When a source voltage level of the fourth NMOS transistor MN4 becomes lower than the level of a second reference voltage VCL, the gate-source voltage Vgs of the fourth NMOS transistor MN4 becomes over the threshold voltage Vth in response to the second control signal. That is, if the voltage level of the second node N2 becomes lower than the level of the second reference voltage VCL, then the fourth NMOS transistor MN4 turns on in response to the second control signal so that a current is provided to the second node N2 through the fourth NMOS transistor MN4. The second reference voltage VCL may be determined according to a minimum voltage level capable of being processed by the ADC 150.

The second control unit 420 may include a second current source IB2 connected to the ground GND, in which a constant current flows, a third amplifier A3 whose one input terminal is connected to an input of the second current source IB2 and the other input terminal is connected to the second reference voltage VCL, and a third NMOS transistor MN3 coupled between the power supply voltage Vdd and the second current source IB2. An output from the output terminal of the third amplifier A3 is applied to a gate of the third NMOS transistor MN3 as the second control signal. The second control signal may have a constant voltage level due to a virtual ground. The second control signal may be further applied to the gate of the fourth NMOS transistor MN4 of the second switching unit 410. When the source voltage level of the fourth NMOS transistor MN4 whose gate receives the second control signal becomes a level of the second reference voltage VCL, the fourth NMOS transistor MN4 turns on, thereby connecting the second node N2 to the power supply voltage Vdd. Thus, a case in which the voltage level of the second node N2 becomes lower than the level of the second reference voltage VCL can be prevented. That is, the voltage level of the second node N2 is clipped at the level of the second reference voltage VCL.

Figure 5:
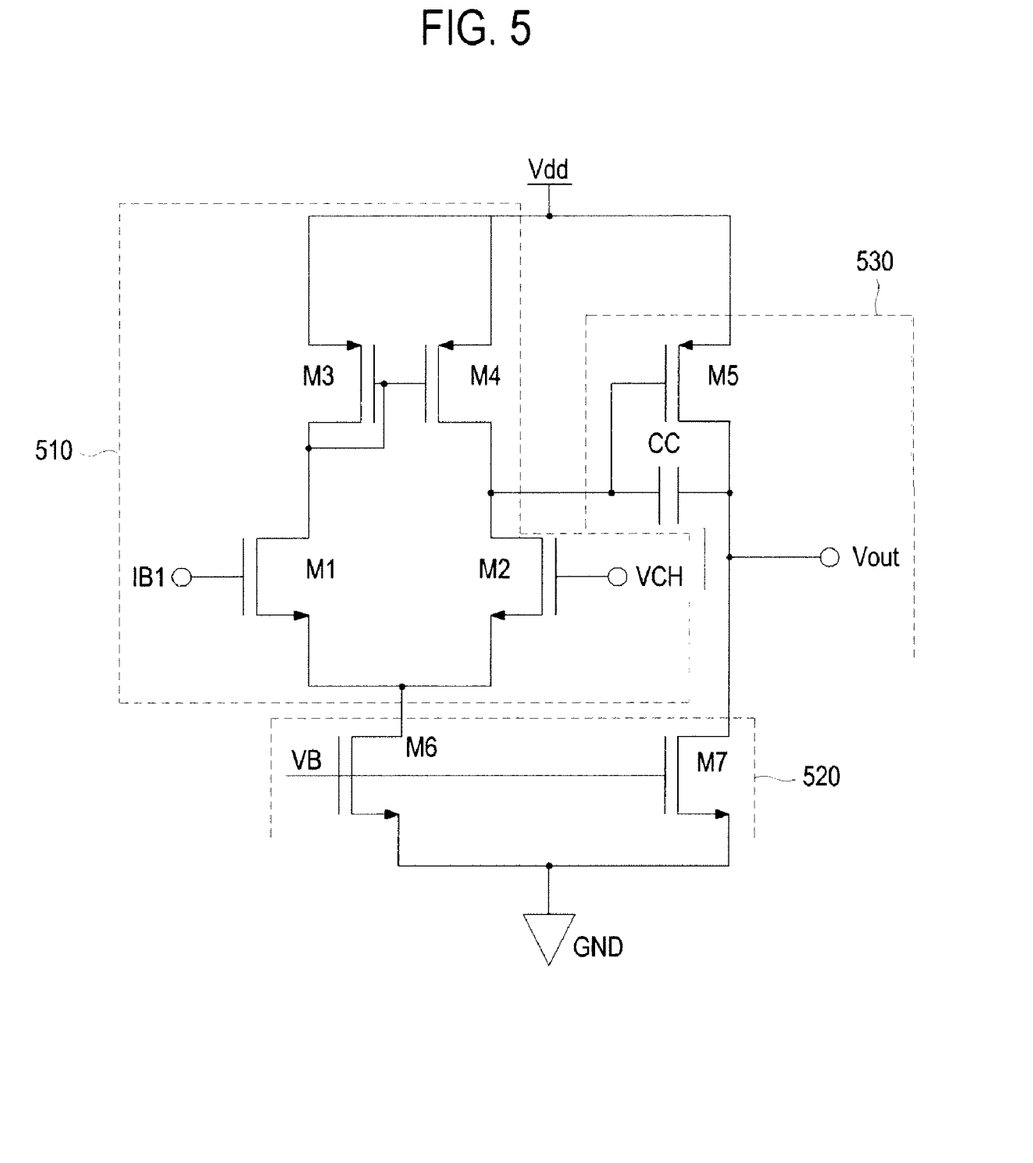
FIG. 5 is a circuit diagram showing a second amplifier in accordance with one embodiment of the present invention.

FIG. 5 is a circuit diagram showing the second amplifier A2 in accordance with one embodiment of the present invention. As shown in FIG. 5, the second amplifier A2 may include an input unit 510 for receiving an output Vin from the first current source IB1 and the first reference voltage VCH, a current source 520 and an output terminal 530 outputting an output signal Vout in response to an input signal. The input unit 510 may include NMOS transistors M1 and M2 whose respective gates are connected to the output of the first current source IB1 and the first reference voltage VCH. The input unit 510 may further include PMOS transistors M3 and M4, which are coupled between the power supply voltage and the NMOS transistors M1 and M2, constructing a current mirror. The current source 520 may include an NMOS transistor M6, which is coupled between the NMOS transistors M1 and M2 and the ground GND, and an NMOS transistor M7 coupled between the output terminal 530 and the ground GND. A constant bias voltage VB may be applied to the gates of the NMOS transistors M6 and M7. The output terminal 530 may include a PMOS transistor M5 coupled between the power supply voltage Vdd and the NMOS transistor M7, as well as a capacitor CC whose one end is commonly coupled to the gate of the PMOS transistor M5 and the drain of the PMOS transistor M4 in the input terminal 510 and the other end is connected to the drain of the PMOS transistor M5.

Figure 6:
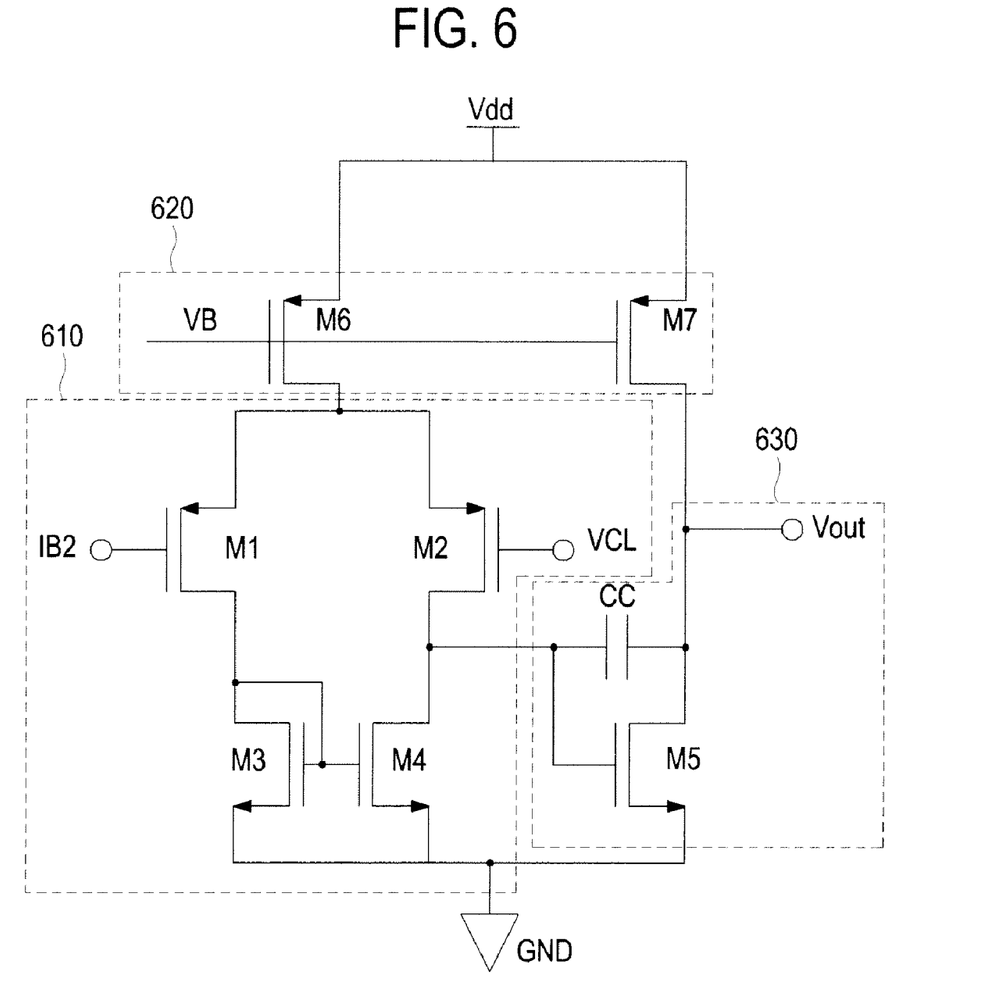
FIG. 6 is a circuit diagram showing a third amplifier in accordance with one embodiment of the present invention.

FIG. 6 is a circuit diagram showing the third amplifier A3 in accordance with one embodiment of the present invention. As illustrated in FIG. 6, the third amplifier A3 may include an input terminal 610 for receiving an output from the second current source IB2 and the second reference voltage VCL as the input signals thereof, a current source 620, and an output terminal 630 operable to output an output signal Vout in response to the input signals.

The input terminal 610 may include PMOS transistors M1 and M2 whose gates are connected to an output Vin of the second current source IB2 and the second reference voltage VCL, as well as NMOS transistors M3 and M4 coupled between the ground GND and the respective PMOS transistors M1 and M4 constructing a current mirror. The current source 620 may include a PMOS transistor M6 coupled between the power supply voltage Vdd and the PMOS transistors M1 and M2, as well as a PMOS transistor M7 coupled between the power supply voltage and the output terminal 530. A constant bias voltage VB may be applied to the gates of the PMOS transistors M6 and M7. The output terminal 630 may include an NMOS transistor M5 coupled between the PMOS transistor M7 and the ground GND, as well as a capacitor CC whose one end is commonly coupled to the gate of the NMOS transistor M5 and the drain of the NMOS transistor M4, and the other end is coupled to the drain of the NMOS transistor M5.

As mentioned above, since the level of the output voltage is clipped in an open loop in response to an input signal in the variable gain amplifier, the clipping operation can be carried out without decreasing an operation speed of the variable gain amplifier. Thus, a malfunction of the analog-to-digital converter may be prevented from the overload of the variable gain amplifier.

In accordance with one embodiment of the present invention, there is provided a variable gain amplifier, comprising: an input unit including first and second input nodes and an output node, said input unit being configured to receive the first and second input signals; a first clipping unit operable to clip a voltage level at the output node to be equal to or lower than a level of a first reference voltage; a second clipping unit operable to clip a voltage level at the output node to be equal to or greater than a level of a second reference voltage, wherein the second reference voltage is lower than the first reference voltage; and an output unit connected to the output node and being operable to output a predetermined level of voltage based on the clipped voltage level.

Any reference in this specification to "one embodiment," "an embodiment," "example embodiment," etc. means that a particular feature, structure or characteristic described in connection with the embodiment is included in at least one embodiment of the present invention. The appearances of such phrases in various places in the specification are not necessarily all referring to the same embodiment. Further, when a particular feature, structure or characteristic is described in connection with any embodiment, it is submitted that it is within the purview of one skilled in the art to effect such feature, structure or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A variable gain amplifier, comprising:
   an input unit including first and second input nodes and an output node, said input unit being configured to receive first and second input signals;
   a first clipping unit operable to clip a voltage level at the output node to be equal to or lower than a level of a first reference voltage;
   a second clipping unit operable to clip a voltage level at the output node to be equal to or greater than a level of a second reference voltage, wherein the second reference voltage is lower than the first reference voltage; and
   an output unit connected to the output node and being operable to output a predetermined level of voltage based on the clipped voltage level.

2. The variable gain amplifier of claim 1, wherein the input unit includes:
   a first transistor coupled between a power supply voltage and the first input node;

a second transistor coupled between the first input node and the output node;

a third transistor coupled between the output node and the second input node; and a fourth transistor coupled between the second input node and a ground;

wherein constant bias voltages are applied to gates of the first to fourth transistors.

3. The variable gain amplifier of claim 2, wherein the output unit includes a first amplifier whose one input terminal is connected to the output node and the other input terminal is connected to an output of the first amplifier.

4. The variable gain amplifier of claim 3, wherein the first clipping unit includes:

a first current source coupled to the power supply voltage;

a second amplifier operable to receive the first reference voltage and an output of the first current source;

a fifth transistor whose gate receives an output of the second amplifier and being coupled between the first current source and the ground; and a sixth transistor whose gate receives an output of the second amplifier and being coupled between the output node and the ground.

5. The variable gain amplifier of claim 4, wherein the second clipping unit includes:

a second current source coupled to the ground;

a third amplifier for receiving the second reference voltage and an input of the second current source;

a seventh transistor whose gate receives an output of the second amplifier and being coupled between the power supply voltage and the second current source; and a eighth transistor whose gate receives an output of the third amplifier and being coupled between the output node and the power supply voltage.

6. The variable gain amplifier of claim 5, wherein the first, second, fifth and sixth transistors are P-type transistors, and wherein the third, fourth, seventh and eighth transistors are N-type transistors.

* * * * *

UNITED STATES PATENT AND TRADEMARK OFFICE
CERTIFICATE OF CORRECTION

| | | |
|---|---|---|
| PATENT NO. | : 7,656,232 B2 | Page 1 of 1 |
| APPLICATION NO. | : 12/163933 | |
| DATED | : February 2, 2010 | |
| INVENTOR(S) | : Kim et al. | |

It is certified that error appears in the above-identified patent and that said Letters Patent is hereby corrected as shown below:

On the title page, Section 73, replace the assignee information to read:

-- Assignee: Medison Co., Ltd., Kangwon-do (KR);

Hivolic Co., Seoul (KR) --

Signed and Sealed this

Third Day of May, 2011

David J. Kappos
*Director of the United States Patent and Trademark Office*